United States Patent
Shimoda et al.

(10) Patent No.: US 11,895,924 B2
(45) Date of Patent: Feb. 6, 2024

(54) PIEZOELECTRIC CERAMIC COMPOSITION AND MANUFACTURING METHOD THEREOF, INCLUDING PIEZOELECTRIC CERAMIC, PIEZOELECTRIC ELEMENT, AND PIEZOELECTRIC VIBRATION DEVICE

(71) Applicant: TAIYO YUDEN CO., LTD., Tokyo (JP)

(72) Inventors: Sadanori Shimoda, Takasaki (JP); Keiichi Hatano, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 1206 days.

(21) Appl. No.: 16/450,707

(22) Filed: Jun. 24, 2019

(65) Prior Publication Data
US 2020/0013944 A1    Jan. 9, 2020

(30) Foreign Application Priority Data
Jul. 6, 2018    (JP) ................ 2018-129256

(51) Int. Cl.
*H10N 30/853*    (2023.01)
*C01G 33/00*    (2006.01)
(Continued)

(52) U.S. Cl.
CPC ......... *H10N 30/8542* (2023.02); *C01G 33/00* (2013.01); *C01G 33/006* (2013.01);
(Continued)

(58) Field of Classification Search
CPC ............ H01L 41/1873; H01L 41/0471; H01L 41/083; H01L 41/273; H01L 41/43;
(Continued)

(56) References Cited

U.S. PATENT DOCUMENTS

2008/0290316 A1    11/2008    Katayama et al.
2013/0188292 A1*    7/2013    Kobayashi ............... H01G 4/30
                                                                501/134

FOREIGN PATENT DOCUMENTS

CN    101219897 A    7/2008
JP    H0323222 A    1/1991
(Continued)

OTHER PUBLICATIONS

Cheng et al. Characteristics improvement of Li0.058(K0.480Na0.535)0.966(Nb0.9Ta0.1)03 lead-free piezoelectric ceramics by LiF additions. 2016. Integrated Ferroelectrics an International Journal. vol. 168. pp. 53-60. (Year: 2016).*

(Continued)

*Primary Examiner* — Jonathan Han
(74) *Attorney, Agent, or Firm* — Law Office of Katsuhiro Arai

(57) ABSTRACT

In an exemplary embodiment, a piezoelectric ceramic composition is an alkali niobate-based piezoelectric ceramic composition whose primary component is a compound expressed by the general formula $Li_xNa_yK_{1-x-y}NbO_3$ (where $0<x<1$, $0<y<1$, and $x+y<1$), and which contains 100 ppm or more but less than 1000 ppm of fluorine by mass. The alkali niobate-based piezoelectric ceramic composition demonstrates good properties even when sintered at low temperature.

7 Claims, 1 Drawing Sheet

(51) Int. Cl.
   *C04B 35/495* (2006.01)
   *C04B 35/622* (2006.01)
   *H10N 30/50* (2023.01)
   *H10N 30/053* (2023.01)
   *H10N 30/097* (2023.01)
   *H10N 30/87* (2023.01)
   *H10N 30/20* (2023.01)

(52) U.S. Cl.
   CPC .......... *C04B 35/495* (2013.01); *C04B 35/622* (2013.01); *H10N 30/053* (2023.02); *H10N 30/097* (2023.02); *H10N 30/50* (2023.02); *H10N 30/871* (2023.02); *C01P 2002/34* (2013.01); *C01P 2006/40* (2013.01); *C01P 2006/80* (2013.01); *H10N 30/206* (2023.02)

(58) Field of Classification Search
   CPC ..... H01L 41/0986; H01L 41/39; C01G 33/00; C01G 33/006; C04B 35/495; C04B 35/622; C04B 35/553; C04B 2235/3201; C04B 2235/3203; C04B 2235/3251; C04B 2235/445; C04B 2235/724; C04B 2235/725; C04B 2235/768; C04B 2235/72; C04B 2235/77; C01P 2002/34; C01P 2006/40; C01P 2006/80; C01P 2002/54; C01P 2006/10; H10N 30/8542; H10N 30/053; H10N 30/097; H10N 30/50; H10N 30/871; H10N 30/206; H10N 30/093
   See application file for complete search history.

(56) References Cited

FOREIGN PATENT DOCUMENTS

| | | | | |
|---|---|---|---|---|
| JP | H03023222 | A | * | 1/1991 |
| JP | 2004244302 | A | | 9/2004 |
| JP | 2009167071 | A | | 7/2009 |
| JP | 2011195383 | A | * | 10/2011 |
| JP | 2011195383 | A | * | 10/2011 |
| JP | 2011195383 | A | | 10/2011 |
| JP | 2013035746 | A | | 2/2013 |
| JP | 2016147798 | A | * | 8/2016 |
| JP | 2016147798 | A | * | 8/2016 |
| JP | 2016147798 | A | | 8/2016 |
| WO | 2007094115 | A1 | | 8/2007 |

OTHER PUBLICATIONS

Bian et al. Structural evolution, sintering behavior and microwave dielectric properties of (1-x)Li3NbO4-xLiF (0≤x≤0.9). 2012. Journal of the European Ceramic Society. vol. 32. pp. 1251-1259. (Year: 2012).*

A Decision of Refusal issued by the Japanese Patent Office, dated May 10, 2022, for Japanese counterpart application No. 2018-129256. (6 page).

A Notice of Reasons for Refusal issued by the Japanese Patent Office, dated Nov. 9, 2021, for Japanese counterpart application No. 2018-129256. (4 page).

A Reconsideration Report by Examiner before Appeal issued by the Japanese Patent Office, dated Aug. 8, 2022, for Japanese counterpart application No. 2018-129256. (3 page).

Bian et al., Structural evolution, sintering behavior and microwave dielectric properties of(1-x)Li3NbO4-xLiF (0≤x≤0.9), Journal of the European Ceramic Society, Jun. 2012, vol. 32, Issue 6, pp. 1251-1259 (11 pages).

Cheng et al., Characteristics improvement of Li0.058(K0.480Na0.535)0.966(Nb0.9Ta0.1)O3 lead-free piezoelectric ceramics by LiF additions, Integrated Feroelectrics, 2016, vol. 168, pp. 53-60 (10 pages).

Khemakhem et al., Dielectric Properties of KTN ferroelectric ceramics sintered with LiF, Ferroelectrics, 1996, vol. 188, pp. 41-51 (13 pages).

Liu et al., Enhancement of Piezoelectric Performance of Lead-Free NKN-Based Ceramics via a High-Performance Flux-NaF-Nb2O5, Journal of the American Ceramic Society, Oct. 2013, vol. 96, Issue 10, pp. 1-7 (9 pages).

A First Office Action issued by the State Intellectual Property Office of China dated Mar. 30, 2022, for Chinese counterpart application No. 201910547301.9 (8 pages).

An et al., Effect of LiF addition on spark plasma sintering of transparent Nd-doped Lu2O3 bodies, Journal of Asian Ceramic Societies, 2, 2014, 154-157.

Tan et al., Effects of LiF on the Structure and Properties of Ba0.85Ca0.15Zr0.1Ti0.9O3 Lead-Free Piezoelectric Ceramics, International Journal of Applied Ceramic Technology, 10 (4), 2013, 701-706.

Tan, Synthesis, structure and properties of lead-free piezoelectric ceramics, Doctoral thesis, Nanyang Technological University, Singapore, 2013, 96-97.

* cited by examiner

PIEZOELECTRIC CERAMIC COMPOSITION AND MANUFACTURING METHOD THEREOF, INCLUDING PIEZOELECTRIC CERAMIC, PIEZOELECTRIC ELEMENT, AND PIEZOELECTRIC VIBRATION DEVICE

CROSS-REFERENCE TO RELATED APPLICATIONS

The present application claims priority to Japanese Patent Application No. 2018-129256, filed Jul. 6, 2018, the disclosure of which is incorporated herein by reference in its entirety including any and all particular combinations of the features disclosed therein.

BACKGROUND

Field of the Invention

The present invention relates to a piezoelectric ceramic composition and manufacturing method thereof, including piezoelectric ceramic, piezoelectric element, and piezoelectric vibration device.

Description of the Related Art

Piezoelectric ceramic compositions are widely used in sensors, actuators, etc., in the form of piezoelectric elements formed by piezoelectric ceramics containing these compositions, in ways utilizing the properties of such piezoelectric elements to generate electrical charges as they undergo mechanical displacement or to be mechanically displaced by potential differences between electrodes.

Among these piezoelectric ceramic compositions, lead zirconate titanate ($Pb(Zr,Ti)O_3$, or PZT) and solid solutions thereof are widely used. PZT-based piezoelectric ceramic compositions have high Curie temperatures and thus are able to provide piezoelectric elements usable in a high-temperature environment. Another advantage of PZT-based piezoelectric ceramic compositions is that they have high electromechanical coupling coefficients and thus are able to provide piezoelectric elements capable of efficiently converting electrical energy and mechanical energy. Furthermore, PZT-based piezoelectric ceramic compositions present yet another advantage in that, if selected properly, these compositions can be sintered at temperatures below 1000° C., which helps reduce the manufacturing costs of piezoelectric elements. Particularly with laminated piezoelectric elements, the ability to use low-melting-point materials containing lower quantities of platinum, palladium, and other expensive materials for the internal electrodes that are sintered simultaneously with the piezoelectric ceramic, produces significant cost saving effects. However, PZT-based piezoelectric ceramic compositions present a problem in that they contain lead, a toxic substance, and there are calls for lead-free piezoelectric ceramic compositions to replace the leaded counterparts.

To date, various lead-free piezoelectric ceramic compositions have been reported, such as those based on alkali niobate (($Li,Na,K)NbO_3$), sodium bismuth titanate (($Bi_{0.5}Na_{0.5})TiO_3$, or BNT), bismuth layer compounds, and tungsten bronze. Among these, alkali niobate-based compositions have high Curie temperatures and relatively high electromechanical coupling coefficients, and thus are drawing attention as substitutes for PZT-based piezoelectric ceramic compositions (Patent Literature 1).

The means reported so far for improving the properties of alkali niobate-based piezoelectric ceramic compositions include adding other elements or compounds (Patent Literatures 1, 2) and forming grains having a core-shell structure (Patent Literature 3). Patent Literature 3 also describes a means for obtaining the aforementioned core-shell structure, which is to add LiF, as a sintering auxiliary, to 100 mol of a tentatively sintered powder expressed by the composition formula ($Na_xK_{1-x})(Nb_yTa_{1-y})O_3$, and then to sinter the mixture. Orienting crystals on specified crystal planes has also been reported as a means for improving the performance of piezoelectric ceramics or piezoelectric elements that use alkali niobate-based piezoelectric ceramic compositions (Patent Literature 4).

BACKGROUND ART LITERATURES

[Patent Literature 1] International Patent Laid-open No. 2007/094115
[Patent Literature 2] Japanese Patent Laid-open No. 2004-244302
[Patent Literature 3] Japanese Patent Laid-open No. 2013-35746
[Patent Literature 4] Japanese Patent Laid-open No. 2009-167071

SUMMARY

However, the properties of the aforementioned alkali niobate-based piezoelectric ceramic compositions are not yet sufficient, and there are calls, in particular, for piezoelectric ceramic compositions that demonstrate good properties when sintered at low temperatures.

Accordingly, an object of the present invention is to provide an alkali niobate-based piezoelectric ceramic composition that demonstrates good properties even when sintered at low temperature.

After conducting various studies to achieve the aforementioned object, the inventor of the present invention found that adding a trace amount of fluorine (F) to an alkali niobate-based piezoelectric ceramic composition would solve the problems, and eventually completed the present invention.

To be specific, an embodiment of the present invention to solve the aforementioned problems represents a piezoelectric ceramic composition expressed by the general formula $Li_xNa_yK_{1-x-y}NbO_3$ (where $0<x<1$, $0<y<1$, and $x+y<1$), and containing 100 ppm or more but less than 1000 ppm of fluorine based on mass.

In addition, another embodiment of the present invention represents a method for manufacturing the aforementioned piezoelectric ceramic composition, wherein the method includes: dispersing a niobium pentoxide ($Nb_2O_5$) powder in water; adding hydrogen fluoride (HF) to the water in which the niobium pentoxide powder has been dispersed and then agitating the liquid mixture; removing the water from the agitated liquid mixture to obtain a fluorine-containing niobium pentoxide powder; mixing the fluorine-containing niobium pentoxide powder with a lithium source, a sodium source, and a potassium source; and sintering the mixture that has been mixed.

In addition, another embodiment of the present invention represents a method for manufacturing the aforementioned piezoelectric ceramic composition, wherein the method includes: dispersing a niobium pentoxide ($Nb_2O_5$) powder in water; adding hydrogen fluoride (HF) to the water in which the niobium pentoxide powder has been dispersed and then agitating the liquid mixture; mixing the agitated liquid mixture with a lithium source, a sodium source, and a potassium source; removing the water from the mixture that has been mixed to obtain a powder; and sintering the powder.

In addition, another embodiment of the present invention represents a piezoelectric ceramic containing the aforementioned piezoelectric ceramic composition, a piezoelectric element containing the piezoelectric ceramic, and a piezoelectric vibration device that includes the piezoelectric element and a vibration plate joined to it.

According to the present invention, an alkali niobate-based piezoelectric ceramic composition that demonstrates good properties even when sintered at low temperature, can be provided.

DESCRIPTION OF THE SYMBOLS

Figure 1A:
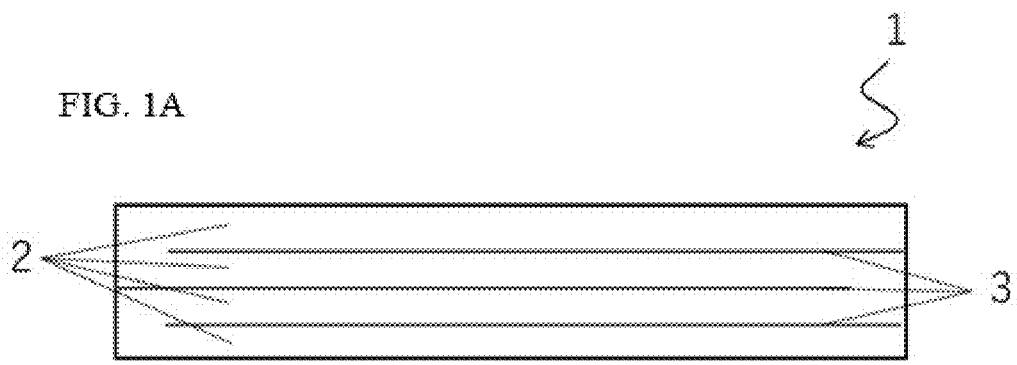
FIGS. 1A and 1B are schematic views showing the structure of a laminated piezoelectric element (FIG. 1A represents a front view, while FIG. 1B represents an oblique view).

| | |
|---|---|
| 1 | Laminated piezoelectric element |
| 2 | Piezoelectric ceramic layers |
| 3 | Internal electrode layers |
| 41, 42 | Connection conductors |
| 51, 52 | Surface electrodes |

DETAILED DESCRIPTION OF EMBODIMENTS

The constitutions and operations/effects of the present invention are explained below, together with the technical ideas, by referring to the drawing. It should be noted that the operating mechanisms are partly based on estimations and whether these estimations are correct or wrong does not limit the present invention. Also, among the constitutional elements in the embodiments below, those constitutional elements not described in the independent claims representing the highest-level concepts are explained as optional constitutional elements.

[Piezoelectric Ceramic Composition]

The piezoelectric ceramic composition pertaining to an embodiment of the present invention (hereinafter referred to as "This Embodiment") is an alkali niobate-based piezoelectric ceramic composition whose primary component is a compound expressed by the general formula $Li_xNa_yK_{1-x-y}NbO_3$ (where $0<x<1$, $0<y<1$, and $x+y<1$), and which contains 100 ppm or more but less than 1000 ppm of fluorine based on mass.

The compound expressed by the general formula $Li_xNa_yK_{1-x-y}NbO_3$ (where $0<x<1$, $0<y<1$, and $x+y<1$) is the primary component of the piezoelectric ceramic composition pertaining to this embodiment. The term "primary component" in this embodiment refers to the component whose content by mass in the piezoelectric ceramic composition is the greatest.

The aforementioned compound contains Li, Na, and K as alkali metals. So long as these three types of elements are contained, their ratios are not limited in any way. From the viewpoint of making it easy to obtain a dense piezoelectric ceramic at lower sintering temperatures, the values of x and y in the general formula mentioned above preferably satisfy $0<x\leq0.3$ and $0.3\leq y<1$, or more preferably satisfy $0.01\leq x\leq0.2$ and $0.4\leq y\leq0.7$, or yet more preferably satisfy $0.01\leq x\leq0.1$ and $0.4\leq y\leq0.6$.

By the following method, it is confirmed that the compound expressed by the aforementioned general formula is the primary component of the piezoelectric ceramic composition pertaining to this embodiment. First, the piezoelectric ceramic composition is measured for diffraction line profile using an X-ray diffraction device based on Cu—K α line (RINT2500 Series manufactured by Rigaku Corporation), and if it is observed from the profile that the primary component has its origin in the perovskite structure, and if the intensity ratio of the most intense diffraction line in the diffraction line profile that likely originates from other structure to the most intense diffraction line originating from the perovskite structure is 10% or below, then that piezoelectric ceramic composition is determined to have a perovskite compound as its primary component. Next, the piezoelectric ceramic composition that has been determined to have a perovskite compound as its primary component is measured for the content ratio of each element using a high-frequency inductively coupled plasma atomic emission spectrometer (ICP-AES; iCAP6500 manufactured by Thermo Fisher Scientific), ion chromatography system (iCS-1600 manufactured by Thermo Fisher Scientific), or X-ray fluorescence (XRF) spectrometer (ZSX Primus-IV manufactured by Rigaku Corporation), and if the ratios conform to those in the aforementioned general formula, the piezoelectric ceramic composition is determined to have a compound expressed by the aforementioned composition formula as its primary component.

The piezoelectric ceramic composition pertaining to this embodiment contains 100 ppm or more but less than 1000 ppm of fluorine based on mass. If the fluorine content is less than 100 ppm, a dense piezoelectric ceramic may not be obtained in some areas at sintering temperatures below 1000° C. From the viewpoint of achieving a high electromechanical coupling coefficient, the fluorine content in the piezoelectric ceramic composition is preferably 200 ppm or more, or more preferably 300 ppm or more, or yet more preferably 400 ppm or more. On the other hand, increasing the fluorine content to more than 1000 ppm does not change the effect of sintering at low temperature. Moreover, such high fluorine content also allows more fluorine to scatter during sintering and thus necessitates stricter measures to prevent fluorine emission into the environment, which adds to manufacturing cost. From the viewpoint of reducing the amount of scattering fluorine, the fluorine content in the piezoelectric ceramic composition is preferably 800 ppm or less, or more preferably 700 ppm or less, or yet more preferably 600 ppm or less.

In the piezoelectric ceramic composition pertaining to this embodiment, inherently the alkali components of Li, Na, and K volatilize easily under the synthesis conditions they are subject to. They may exist as $Li_2O$, $Na_2O$ and $K_2O$, but these also volatilize easily in the sintering ambience. For this reason, as a whole, the perovskite structure tends to be deficient in alkali components, while also being oxygen deficient. In this case, at least some of the fluorine content replaces some of the oxygen in the compound expressed by the aforementioned general formula $Li_xNa_yK_{1-x-y}NbO_3$, to guarantee electrical charge neutrality of this piezoelectric ceramic composition. When a defect in crystal structure is indicated by □, ideally forming a perovskite structure according to the composition formula $(Li_xNa_yK_{1-x-y})_{1-\delta}\square_\delta NbO_{3-\delta}F_\delta$ will likely maintain the effect of the law of electrical charge neutrality. Needless to say, this suppresses the ionic conduction behaviors associated with defects in the piezoelectric ceramic composition, which is probably why it exhibits good electrical and piezoelectric properties.

The fluorine content in the piezoelectric ceramic composition in this embodiment is determined by dissolving several tens of milligrams of the piezoelectric ceramic composition in approx. 10 mL of hydrofluoric acid and nitric acid, and then measuring the resulting solution using a high-frequency inductively coupled plasma atomic emission spectrometer (ICP-AES). Here, preferably the fluorine content is determined from the calibration curves of fluorine content obtained from multiple samples having pre-specified contents of fluorine.

Additionally, another method for measuring the fluorine content in the piezoelectric ceramic composition pertaining to this embodiment involves taking approx. 30 mg of the piezoelectric ceramic composition into a combustion boat, adding tungsten oxide as an additive by five times the quantity of the sample, burning the sample at 1000° C. and collecting the generated gas with an absorption liquid, introducing the absorption liquid into an ion chromatography system, and performing a quantitative analysis of fluorine according to the calibration curve method. Here, preferably the fluorine content in the absorption liquid is determined from the calibration curves obtained from multiple standard liquid samples having pre-specified contents of fluorine.

The fluorine content may be determined based on an analysis result using only one of the aforementioned methods, or more accurately by comparing and studying multiple results using both methods.

From the viewpoint of suppressing characteristic variation, preferably the piezoelectric ceramic composition pertaining to this embodiment is such that its total nickel and zirconium content in equivalent oxides is 100 ppm (based on mass) or less. If this content exceeds 100 ppm, the piezoelectric ceramic composition may have mottled colors and become lower in dielectric constant, electromechanical coupling coefficient, piezoelectric constant, and other properties.

For the method to obtain the contents of nickel and zirconium in the piezoelectric ceramic composition pertaining to this embodiment, a method equivalent to the one mentioned above for evaluating fluorine may be used.

[Manufacturing Method of Piezoelectric Ceramic Composition]

To manufacture the piezoelectric ceramic composition pertaining to this embodiment, a normal solid-phase reaction method may be adopted whereby a powder material is mixed in and the mixture is sintered; from the viewpoint of uniformly dispersing a trace amount of fluorine, however, preferably the following manufacturing method is adopted that incorporates an improved material mixing method.

First, a niobium pentoxide ($Nb_2O_5$) powder is prepared and dispersed in water.

The type of niobium pentoxide powder to be used is not limited in any way, but given the negative effects that nickel, zirconium and other impurities could have in the resulting piezoelectric ceramic compositions, preferably a niobium pentoxide powder of as high a purity as possible is used. Similarly, the water to be used is not limited in any way, but given the negative effects of impurities as mentioned above, preferably distilled water or ion-exchanged water is used.

The dispersed concentration of niobium pentoxide in water is not limited in any way so long as it is within a range where uniform dispersion without separation is achieved, such as 100 g/L to 700 g/L. The aforementioned concentration is more preferably between 200 g/L and 700 g/L. The higher the concentration, the greater the suitability to mass-production becomes; however, an excessively high concentration prevents sufficient agitation.

Next, hydrogen fluoride (HF) is added to the water in which the niobium pentoxide powder has been dispersed, and the mixture is agitated.

The mode in which hydrogen fluoride is added is not limited in any way, but from the viewpoint of enabling a strict control of additive quantity, preferably it is added in the form of aqueous solution, or specifically hydrofluoric acid. In this case, the concentration of hydrofluoric acid may be set in any way as deemed appropriate by considering the ease of handling, the size of the container holding the niobium pentoxide-dispersed water, concentration of the niobium pentoxide powder in water, and so on.

As an example of additive quantity, it is assumed that the final product, or specifically potassium sodium lithium niobate, has the composition formula of $Li_{0.06}Na_{0.52}K_{0.42}NbO_3$; then, adding enough HF to achieve a ratio of 0.00067 g/mol to 1 mol of the dispersed niobium pentoxide is all that is needed to make sure 500 ppm (ratio by weight) of fluorine is contained. The aforementioned fluorine content may be changed as deemed necessary within a range of 20 ppm to 2000 ppm.

It is estimated that, by adding hydrogen fluoride (HF) to the water in which the niobium pentoxide powder has been dispersed and then agitating the mixture, a niobium pentoxide powder containing fluorine (hereinafter referred to as "Fluorine-containing Niobium Pentoxide Powder") is produced.

Next, the fluorine-containing niobium pentoxide powder is mixed with a lithium source, a sodium source, and a potassium source, all of which are the sources of other components of the piezoelectric ceramic composition.

Examples of components to be mixed in include lithium carbonate ($Li_2CO_3$), etc., for the lithium source, sodium carbonate ($Na_2CO_3$), sodium hydrogen carbonate ($NaHCO_3$), etc., for the sodium source, and potassium carbonate ($K_2CO_3$), potassium hydrogen carbonate ($KHCO_3$), etc., for the potassium source, respectively.

The mixing may take the form of adding hydrofluoric (HF) acid to the water in which the niobium pentoxide powder has been dispersed and then agitating the mixture, removing the water from the obtained dispersion liquid (hereinafter referred to as "Fluorine-containing Niobium Pentoxide Dispersion Liquid"), and mixing the obtained fluorine-containing niobium pentoxide powder with the lithium source, sodium source, and potassium source (first mixing mode), or it may take the form of mixing the lithium source, sodium source, and potassium source into the fluorine-containing niobium pentoxide dispersion liquid (second mixing mode). If the first mixing mode is adopted, either dry mixing or wet mixing may be adopted. The mixing conditions are not limited in any way so long as they allow the fluorine-containing niobium pentoxide powder to be mixed uniformly with the lithium source, sodium source, and potassium source. If wet mixing using a ball mill is adopted, approx. 8 to 24 hours of mixing will suffice, for example.

Next, the mixture of fluorine-containing niobium pentoxide powder, lithium source, sodium source, and potassium source, is sintered to obtain a piezoelectric ceramic composition.

The sintering conditions are not limited in any way so long as the respective materials react with one another to produce a potassium sodium lithium niobate expressed by the aforementioned composition formula, such as sintering at 700° C. to 1000° C. for 2 to 8 hours in atmosphere. If the sintering temperature is too low or the sintering time is too short, unreacted materials or intermediate products may remain. If the sintering temperature is too high or the sintering time is too long, on the other hand, a compound of desired composition may not be obtained due to volatilization of alkali components or fluorine, or the productivity may drop because the product hardens and becomes difficult to crush.

[Piezoelectric Ceramic]

The piezoelectric ceramic composition pertaining to this embodiment is formed, and then sintered, into a piezoelectric ceramic.

For the forming method, uniaxial press forming of powder, extrusion forming of a green body containing powder, cast forming of slurry where powder is dispersed, or any other method normally used for ceramic powder forming, may be adopted.

The conditions under which the formed product is sintered are not limited in any way so long as a dense piezoelectric ceramic can be obtained, such as sintering at 850° C. up to 1000° C. for 1 to 5 hours in atmosphere. If the sintering temperature is too low or the sintering time is too short, a piezoelectric ceramic or piezoelectric element of desired characteristics may not be obtained due to insufficient density; if the sintering temperature is too high or the sintering time is too long, on the other hand, the composition may deviate due to volatilization of alkali components or fluorine, or the properties may drop due to production of coarse grains.

[Piezoelectric Element]

Once the piezoelectric ceramic composition in this embodiment has turned into a piezoelectric ceramic, electrodes are formed on its surface and then polarized to produce a piezoelectric element.

For the formation of electrodes, a method whereby a paste containing electrode material is applied or printed on the piezoelectric ceramic surface and baked, a method whereby an electrode material is deposited on the piezoelectric ceramic surface, or any other commonly used method, may be adopted. The electrode material is not limited in any way so long as it is a highly conductive material that is physically and chemically stable in the use environment of the piezoelectric element. Examples of electrode materials that can be used include silver (Ag), copper (Cu), gold (Au), platinum (Pt), palladium (Pd), nickel (Ni), and alloys thereof, etc.

The polarization conditions are not limited in any way so long as the orientations of spontaneous polarizations can be aligned without causing the piezoelectric ceramic to crack or sustain other damage. One example is to apply an electric field of 1 kV/mm to 5 kV/mm at a temperature of 100° C. to 200° C.

[Laminated Piezoelectric Element]

The piezoelectric element may be a laminated piezoelectric element. The structure of a laminated piezoelectric element is explained below by referring to FIGS. 1A and 1B.

Figure 1B:
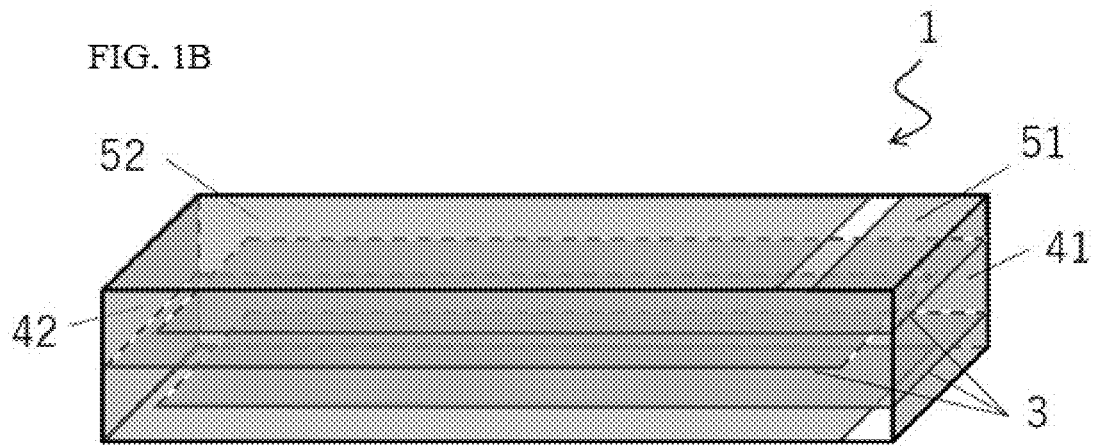

The laminated piezoelectric element 1 schematically illustrated in FIGS. 1A and 1B comprises: a laminate constituted by piezoelectric ceramic layers 2 alternately stacked with internal electrode layers 3; a pair of connection conductors 41 and 42, each electrically connected to a different set of every other internal electrode layer 3; and surface electrodes 51 and 52 provided on the surface of the laminate and electrically connected to the pair of connection conductors, respectively. It should be noted that, while the figure shows a structure where the parts of the internal electrode layers 3 not connected to the connection conductors 41 and 42 are exposed at the end faces of the element in order to give a better grasp of the positions of the internal electrode layers 3, the element structure is not limited to the foregoing and a structure where the parts of the internal electrode layers 3 not connected to the connection conductors 41 and 42 are unexposed at the end faces of the element is also feasible.

The piezoelectric ceramic layer 2 is formed by the aforementioned piezoelectric ceramic and therefore not explained.

The internal electrode layers 3, which are alternately stacked with the piezoelectric ceramic layers 2 and which also bear two different electrode patterns that are alternately provided on every other layer, constitute a laminate structure that forms the basis of the laminated piezoelectric element 1.

The electrode material that constitutes the internal electrode layers 3 is not limited in any way so long as it is a highly conductive material that is physically and chemically stable in the use environment of the laminated piezoelectric element 1. If the one-piece sintering of piezoelectric ceramic layers 2 and the internal electrode layers 3 described below is adopted in the manufacture of the laminated piezoelectric element 1, it is also necessary for the material to be physically and chemically stable at the sintering temperature and in the sintering ambience. Examples of electrode materials that can be used include silver (Ag), copper (Cu), gold (Au), platinum (Pt), palladium (Pd), nickel (Ni), and alloys thereof, etc.

The connection conductors 41 and 42 are electrically connected to every other internal electrode layer 3. To be specific, the connection conductor 41 is electrically connected to the odd-numbered internal electrode layers 3 from the top, while the connection conductor 42 is electrically connected to the even-numbered internal electrode layers 3 from the top. It should be noted that, in these electrical connections, the odd-numbered layers may be swapped with the even-numbered layers. Additionally, while the connection conductors 41 and 42 are connected to the exposed parts of the internal electrode layers 3 at the end faces of the laminated piezoelectric element 1 in FIGS. 1A and 1B, the mode of connection between the connection conductors 41 and 42 and the internal electrode layers 3 is not limited to the foregoing, and they may be connected by through (via) holes that penetrate through the piezoelectric ceramic layers 2, for example.

The material that constitutes the connection conductors 41 and 42 is not limited in any way so long as it is a highly conductive material that is physically and chemically stable in the use environment of the laminated piezoelectric element 1. If the connection conductors 41 and 42 are formed by one-piece sintering with the piezoelectric ceramic layers 2, just like the internal electrode layers 3 are, then it is also necessary for the material to be physically and chemically stable at the sintering temperature and in the sintering ambience. Examples of electrode materials that can be used include silver (Ag), copper (Cu), gold (Au), platinum (Pt), palladium (Pd), nickel (Ni), and alloys thereof, etc. The electrode material that constitutes the connection conductors 41 and 42 may be the same as, or different from, the electrode material that constitutes the internal electrode layers 3.

The surface electrodes 51 and 52 are provided on the surface of the laminated piezoelectric element 1, and electrically connected to the connection conductors 41 and 42, respectively. If the aforementioned connection conductors 41 and 42 are provided on the surface of the laminated piezoelectric element 1, the connection conductors 41 and 42 may also serve as the surface electrodes 51 and 52.

The electrode material that constitutes the surface electrodes 51 and 52 is not limited in any way so long as it is a highly conductive material that is physically and chemically stable in the use environment of the laminate piezoelectric element 1. Examples of electrode materials that can be used include silver (Ag), copper (Cu), gold (Au), platinum (Pt), palladium (Pd), nickel (Ni), and alloys thereof, etc. The electrode material that constitutes the surface electrodes 51 and 52 may be the same as, or different from, the electrode material that constitutes the internal electrode layers 3 and/or connection conductors 41 and 42.

[Manufacturing Method of Laminated Piezoelectric Element]

For the manufacture of the laminated piezoelectric element 1 containing the piezoelectric ceramic composition pertaining to this embodiment, any general manufacturing method of laminated element may be adopted. As an example, a method whereby the piezoelectric ceramic layers 2 and the internal electrode layers 3 are sintered as one piece is explained below.

First, the piezoelectric ceramic composition from which to form the piezoelectric ceramic layers 2 is mixed with a binder, etc., to form a slurry or green body, which is then formed into sheet-like shapes to obtain green sheets containing the piezoelectric ceramic composition. For the sheet forming method, the doctor blade method, extrusion forming method or any other commonly used method may be adopted.

It should be noted that, to manufacture the laminated piezoelectric element 1 whose internal electrode layers 3 and connection conductors 41 and 42 are connected by through (via) holes as described above, punching, laser beam irradiation, etc., is used to form through holes in the obtained green sheets.

Next, electrode patterns that become the internal electrode layers 3 after sintering are formed on the green sheets containing the piezoelectric ceramic composition. The electrode patterns may be formed using any commonly used method, but a method whereby a paste containing electrode material is printed or coated is preferred in terms of cost. When forming the electrode patterns by printing or coating, the paste may contain glass frit or the piezoelectric ceramic composition to improve the strength of adhesion to the piezoelectric ceramic layers 2 after sintering.

It should be noted that, to manufacture the laminated piezoelectric element 1 whose internal electrode layers 3 and connection conductors 41 and 42 are connected by through (via) holes, as described above, an electrode material that will become the connection conductors 41 and 42 after sintering is filled in the through holes formed in the green sheets before or after the formation of electrode patterns. The filling method is not limited in any way, but a method whereby a paste containing electrode material is printed is preferred in terms of cost.

Next, a specified number of green sheets on which the electrode patterns have been formed are stacked and bonded together to obtain a formed green body. The stacking and bonding may be performed using any commonly used method, but a method whereby the green sheets are thermally compressed together using the action of a binder is preferred in terms of cost.

Next, the binder is removed from the formed green body and sintered. The binder removal and sintering may be performed successively using the same sintering apparatus. The conditions for binder removal and sintering may be set in any way as deemed appropriate by considering the volatilization temperature and content of the binder, sintering property of the piezoelectric ceramic composition, durability of the internal electrode material, etc. If copper (Cu) or nickel (Ni) is used as the internal electrode material, preferably sintering is performed in a reducing or inert ambience in order to prevent the internal electrodes from being oxidized. Sintering at 850° C. or higher but lower than 1000° C. for 1 to 5 hours in atmosphere is an example of sintering conditions that can be used when the internal electrode material contains neither copper (Cu) nor nickel (Ni). To obtain multiple piezoelectric elements from one formed green body, the formed green body may be divided into several blocks prior to sintering.

To provide the connection conductors 41 and 42 on the surface of the laminated piezoelectric element 1, the connection conductors 41 and 42 are formed, after sintering, on the end faces of the sintered body in a manner connecting the internal electrode layers 3 exposed at the end faces. Also, the surface electrodes 51 and 52 are formed on the surface of the sintered laminate. The connection conductors 41 and 42 and/or the surface electrodes 51 and 52 may be formed using any commonly used method, where, in addition to a method whereby a paste containing electrode material is printed or coated, deposition may also be adopted.

Once the connection conductors 41 and 42 and/or the surface electrodes 51 and 52 have been formed, polarization is performed under the aforementioned conditions to obtain the laminated piezoelectric element 1.

[Piezoelectric Vibration Device]

The piezoelectric element containing the piezoelectric ceramic composition pertaining to this embodiment is used favorably in a piezoelectric vibration device. The vibration device using the piezoelectric element operates when electrical signals are applied to the piezoelectric element to vibrate the element, which in turn vibrates a vibration plate.

The material of the vibration plate used is not limited in any way so long as it vibrates when the piezoelectric element vibrates; for example, polycarbonate, acrylic, or other resin, SUS, brass, or other metal, glass, etc., may be used. The dimensions and shape of the vibration plate are not limited in any way, either; for example, a rectangular plate, polygonal plate, circular plate, elliptical plate, etc., of 10 to 500 μm in thickness may be used.

The means for joining the piezoelectric element to the vibration plate is not limited in any way so long as the vibration of the piezoelectric element can be efficiently transmitted to the vibration plate; epoxy resin or other adhesive, double-sided tape, etc., may be used.

EXAMPLES

The present invention is explained in greater detail below using examples; it should be noted, however, that the present invention is not limited to these examples.

Examples 1 to 5 and Comparative Examples 1, 2

First, a fluorine-containing niobium pentoxide powder was fluorine-concentration adjusted according to Examples 1 to 5 and Comparative Examples 1, 2 in Table 1 in order to evaluate the impact of fluorine content in the powder. The procedure is described below.

A niobium pentoxide powder of 99.5% or higher purity was dispersed in ion-exchanged water of twice the quantity to prepare a dispersion liquid. For the container, a PET container was used.

Next, hydrofluoric acid of 46 percent by weight in concentration was slowly dripped into the dispersion liquid until the fluorine concentration in the dispersion liquid reached a level between 0 and 1500 ppm (multiple samples with different levels between 0 and 1500 ppm were prepared). Then, the dispersion liquid into which the hydrofluoric acid had been dripped was put in a PET container together with Teflon (registered trademark) balls and agitated slowly on an agitation table at a rotational speed of 10 rpm or less overnight.

Then, the agitated dispersion liquid was heated to 100° C. in a draft chamber to evaporate the moisture content, after which the remaining powder was collected as a fluorine-containing niobium pentoxide powder having the concentration corresponding to the fluorine concentration in the dispersion.

After that, the fluorine-containing niobium pentoxide powder, as well as a lithium carbonate ($Li_2CO_3$) powder, a sodium carbonate ($Na_2CO_3$) powder, and a potassium carbonate ($K_2CO_3$) powder, all of 99.5% or higher purity, were weighed so that they will eventually form a compound expressed by the general formula $Li_{0.06}Na_{0.52}K_{0.42}NbO_3$, after which the weighed powders were sealed in a PET container together with alcohol of three times the quantity of powder as well as zirconium balls, and then wet-mixed for 24 hours.

Subsequently, this agitated dispersion liquid was heated to 80° C. to volatilize and thus separate the alcohol, and then the obtained powder mixture was transferred in to an alumina crucible and sintered in air at 900° C. for 3 hours in a batch sintering oven, to obtain a tentatively sintered powder representing the piezoelectric ceramic composition in each example or comparative example of the present invention.

Afterward, the obtained piezoelectric ceramic composition powder was put in a PET container together with alcohol of three times the quantity of powder as well as zirconium balls, and crushed for 24 hours. The crushed powder was heated to 80° C. to volatilize and thus separate the alcohol, and then granulated using polyvinyl alcohol (PVA) as a binder, after which the obtained granulated powder was uniaxially press-formed into a disk shape of 10 mm in diameter and 0.5 mm in thickness. Thereafter, the disk-shaped formed body was sintered at a temperature between 960° C. and 1000° C. to obtain a piezoelectric ceramic.

A silver paste was coated on both sides of the obtained disk-shaped piezoelectric ceramic, which was then baked at approx. 800° C. and applied with an electric field of 3 kV/mm for 15 minutes in 150° C. silicone oil for polarization, to obtain a piezoelectric element.

The modes of the obtained piezoelectric ceramic and piezoelectric element were evaluated using the methods described below. The fluorine content in the piezoelectric ceramic was evaluated using an ICP-AES or by ion chromatography as described above. It was also confirmed, by means of XRD and XRF, that the piezoelectric ceramic had a perovskite compound as its primary component, as described above.

Also, the density of the piezoelectric ceramic was measured and calculated based on the Archimedes method.

The electromechanical coupling coefficient $K_p$ (electromechanical coupling coefficient in the radial direction of the disk) and piezoelectric constant $d_{31}$ (piezoelectric constant in the direction perpendicular to the polarization axis) of the piezoelectric element were calculated from the impedance measurement result using the resonance-antiresonance method. The measurement was performed according to JEITA EM-4501. Also, $\varepsilon_{33}^T/\varepsilon_0$ was measured as the dielectric constant, together with the dielectric loss tan δ. The dielectric constant was measured under the settings of 1 kHz and 1 Vp-p in voltage.

The results obtained by the method described above, from the examples and comparative examples performed to evaluate the impact of the fluorine content in the fluorine-containing niobium pentoxide powder, are shown under Examples 1 to 5 and Comparative Examples 1, 2 in Table 1. The results of each of the examples and comparative examples are explained below. It should be noted that, in the table, "N.D." (Not Detectable) means the result was below 5 ppm.

Examples 1 to 5 are examples that can explain the effects of fluorine content in a piezoelectric ceramic whose primary component is a compound expressed by the general formula proposed by the present invention and which also contains a specified quantity of fluorine. In Examples 1 to 5, the perovskite compound was mixed at the composition ratios of $Li_{0.06}Na_{0.52}K_{0.42}NbO_3$. Comparative Example 1 presents the results pertaining to a piezoelectric ceramic from which fluorine was not detected, because it was tested without adding hydrofluoric acid in the aforementioned process proposed by the present invention. Comparative interpretations of Examples 1 to 5 and Comparative Example 1 show that the piezoelectric ceramic in Comparative Example 1 has a low density and produces a dielectric loss of 4%, a state that makes it inadequate as piezoelectric ceramic. If this piezoelectric ceramic producing such high dielectric loss is used to produce the aforementioned laminated piezoelectric element, for example, an electrical loss of the components increases in a driven state and causes heat to generate easily while the element is driven, which precludes full assurance of the element's operation at room temperature or higher. On the other hand, an electrical loss of the components in a driven state can be kept low with the piezoelectric elements in Examples 1 to 5 whose dielectric loss is around 2% and which fall within the scope proposed by the present invention. Accordingly, it can be said that application of the present invention facilitates design of more reliable piezoelectric devices that use piezoelectric elements, particularly laminated piezoelectric elements. In addition, the $K_p$ and $d_{31}$ values in Examples 1 to 5 also remained at sufficient levels compared to Comparative Example 1, which leads to a conclusion that piezoelectric devices can be designed without having to compromise on their displacement performance.

Comparative Example 2 presents the results pertaining to a piezoelectric ceramic whose hydrofluoric acid content was adjusted to 1500 ppm for testing. As shown in Table 1, the fluorine content was 1190 ppm, which is significantly low given how much hydrofluoric acid was mixed in for testing. It can be speculated that the test procedure or any of various other causes may have contributed to this result, but in Comparative Example 2, an excessive fluorine content was observed under exposure to high temperature during sintering; accordingly, it is likely that, as mentioned above, fluorine did not replace the oxygen in the perovskite structure and volatilized. Also, the density was lower than in Examples 1 to 5 that fall within the scope proposed by the present invention, the dielectric loss was high at 5.2%, and the dielectric constant also dropped; accordingly, it was determined that the characteristic effects of the present invention cannot be achieved.

Examples 6 and 7

Examples 6 and 7 are examples that can explain if, pertaining to a piezoelectric ceramic whose primary component is a compound expressed by the general formula proposed by the present invention and which also contains a specified quantity of fluorine, the effects of the present invention can be achieved by adjusting the quantities of Na and K of a perovskite compound as its primary component. The piezoelectric ceramic in Example 6 was synthesized as $Li_{0.06}Na_{0.47}K_{0.47}NbO_3$, while that in Example 7 was synthesized as $Li_{0.06}Na_{0.55}K_{0.39}NbO_3$, both according to a procedure equivalent to the one used in Examples 1 to 5, and evaluated.

As it is clear from the results of Examples 6 and 7 shown in Table 1 that their dielectric loss is sufficiently smaller than, for example, 4% in Comparative Example 1, it was determined that effects similar to those shown by the aforementioned Examples 1 to 5 were achieved. It was therefore determined that application of the present invention facilitates design of more reliable piezoelectric devices that use piezoelectric elements, particularly laminated piezoelectric elements.

tive Example 3, the confirmed results of properties pertaining to a piezoelectric ceramic and a piezoelectric element, both produced using the powders, among those determined to have poor appearance, whose composition formula and fluorine content were similar to those in Comparative Example 1. When these powders were used, the sintering property was lowered as compared to Comparative Example 1 where neither nickel nor zirconium was detected, and large grains of 100 microns or more were observed in the sintered body produced from the powders. Furthermore, the piezoelectric properties dropped significantly as a result of uneven sintering.

From the above results, preferably the total content of nickel and zirconium in the piezoelectric ceramic composition is kept to 100 ppm or less (based on mass) in equivalent oxides to stably obtain a piezoelectric ceramic and a piezoelectric element even when sintered at low temperature.

In this disclosure, any components or elements which are not expressly disclosed can be completely positively

TABLE 1

| | Composition formula | F content [ppm] | Ni content (in equivalent NiO) [% by mass] | Zr content (in equivalent ZrO2) [% by mass] | Sintering temperature [° C.] | Density [g/cm$^3$] | Dielectric constant ($\epsilon_{33}^T/\epsilon_0$) | Dielectric loss (tan$\delta$) [%] | Electromechanical coupling coefficient (Kp) [%] | Piezoelectric constant ($d_{31}$) [pC/N] |
|---|---|---|---|---|---|---|---|---|---|---|
| Example 1 | $Li_{0.06}Na_{0.52}K_{0.42}NbO_3$ | 210 | N.D. | N.D. | 980 | 4.30 | 920 | 3.0 | 41 | −77 |
| Example 2 | $Li_{0.06}Na_{0.52}K_{0.42}NbO_3$ | 360 | N.D. | N.D. | 980 | 4.35 | 900 | 1.4 | 41 | −77 |
| Example 3 | $Li_{0.06}Na_{0.52}K_{0.42}NbO_3$ | 430 | N.D. | N.D. | 980 | 4.36 | 870 | 1.7 | 46 | −82 |
| Example 4 | $Li_{0.06}Na_{0.52}K_{0.42}NbO_3$ | 550 | N.D. | N.D. | 960 | 4.34 | 850 | 1.7 | 45 | −80 |
| Example 5 | $Li_{0.06}Na_{0.52}K_{0.42}NbO_3$ | 800 | N.D. | N.D. | 960 | 4.34 | 800 | 1.6 | 45 | −78 |
| Example 6 | $Li_{0.06}Na_{0.47}K_{0.47}NbO_3$ | 460 | N.D. | N.D. | 980 | 4.33 | 880 | 2.0 | 43 | −79 |
| Example 7 | $Li_{0.06}Na_{0.55}K_{0.39}NbO_3$ | 510 | N.D. | N.D. | 980 | 4.36 | 990 | 2.1 | 47 | −86 |
| Comparative Example 1 | $Li_{0.06}Na_{0.52}K_{0.42}NbO_3$ | <50 | N.D. | N.D. | 980 | 4.29 | 915 | 4.0 | 41 | −75 |
| Comparative Example 2 | $Li_{0.06}Na_{0.52}K_{0.42}NbO_3$ | 1190 | N.D. | N.D. | 960 | 4.22 | 690 | 5.2 | 39 | −68 |
| Comparative Examole 3 | $Li_{0.06}Na_{0.52}K_{0.42}NbO_3$ | <50 | 0.01 | 0.14 | 1000 | 4.32 | 370 | 2.8 | 25 | −26 |

N.D.: Not Detectable

It is evident from the above results that a piezoelectric ceramic composition whose primary component is a compound expressed by the general formula $Li_xNa_yK_{1-x-y}NbO_3$ demonstrates good properties, even when sintered at low temperature, so long as it contains 100 ppm or more but less than 1000 ppm of fluorine based on mass. In particular, a high electromechanical coupling coefficient was obtained in Example 2 where the fluorine content was 400 ppm or more.

[Examination of Impact of Nickel and Zirconium Quantities]

Next, the impact of the quantities of nickel and zirconium contained in the piezoelectric ceramic composition on its properties was examined. Piezoelectric ceramic composition powders were prepared in the same manner as in Examples 1 to 5 and Comparative Example 1, except that a metal container and zirconium balls were used when a fluorine-containing niobium pentoxide powder was produced using hydrofluoric acid, and the obtained powders contained Ni by 0.01 to 0.03 percent by mass (100 to 300 ppm) in equivalent NiO, and Zr by 0.12 to 0.14 percent by mass (1200 to 1400 ppm) in equivalent $ZrO_2$. Depending on the batch in which they were prepared, some of the powders had appearance and properties similar to those in Examples 1 to 5 and Comparative Example 1, while others had mottled colors and were determined to have poor appearance before the properties were measured. Table 1 shows, under Comparaexcluded from any disclosed materials or can be excluded positively except for the presence as unavoidable impurities in the materials. Further, in this disclosure, any listed components or elements as optional, alternative, or additional components or elements can be completely positively excluded from any disclosed materials or can be excluded positively except for the presence as unavoidable impurities in the materials. Also, in this disclosure, the terms "constituted by" and "having" refer independently to "typically or broadly comprising," "comprising," "consisting essentially of," or "consisting of," and the language "consisting of" does not exclude additional components that are unrelated to the invention such as impurities ordinarily associated therewith.

[Industrial Field of Application]

According to the present invention, an alkali niobate-based piezoelectric ceramic composition that demonstrates good properties even when sintered at low temperature, can be provided. This means that the element manufacturing cost can be reduced, especially for a laminated piezoelectric element, because an inexpensive material of low melting point can be used for the internal electrodes. Also, the piezoelectric ceramic composition pertaining to the present invention is characterized by a particularly high electromechanical coupling coefficient, so a piezoelectric element containing such composition can efficiently convert the input electrical energy to mechanical vibration. As a result, piezoelectric elements containing the piezoelectric ceramic composition pertaining to the present invention can be used favorably in piezoelectric vibration devices.

We claim:

1. A piezoelectric ceramic composition whose primary component is a compound expressed by a general formula $Li_xNa_yK_{1-x-y}NbO_3$ (where $0<x<1$, $0<y<1$, and $x+y<1$), and which contains 300 ppm or more but 600 ppm or less of fluorine by mass.

2. The piezoelectric ceramic composition according to claim 1, wherein the general formula satisfies $x \leq 0.3$ and $0.3 \leq y$.

3. The piezoelectric ceramic composition according to claim 1, wherein a total content of nickel and zirconium is 100 ppm or less by mass in equivalent oxides.

4. A piezoelectric ceramic containing the piezoelectric ceramic composition of claim 1.

5. A piezoelectric element containing the piezoelectric ceramic of claim 4.

6. The piezoelectric element according to claim 5, wherein the piezoelectric element comprises:
- a laminate formed of piezoelectric ceramic layers constituted by the piezoelectric ceramic composition, stacked alternately with internal electrode layers;
- a pair of connection conductors, each electrically connected to a different set of every other internal electrode layer; and
- surface electrodes provided on a surface of the laminate and electrically connected to the pair of connection conductors, respectively.

7. A piezoelectric vibration device comprising the piezoelectric element of claim 5 and a vibration plate joined to the piezoelectric element.

* * * * *